United States Patent [19]

Sheng et al.

[11] Patent Number: 5,572,038

[45] Date of Patent: Nov. 5, 1996

[54] CHARGE MONITOR FOR HIGH POTENTIAL PULSE CURRENT DOSE MEASUREMENT APPARATUS AND METHOD

[75] Inventors: Terry T. Sheng; Charles B. Cooper, III, both of San Jose; Susan B. Felch, Los Altos; Charles E. Van Wagoner, San Jose, all of Calif.

[73] Assignee: Varian Associates, Inc., Palo Alto, Calif.

[21] Appl. No.: 59,033

[22] Filed: May 7, 1993

[51] Int. Cl.$^6$ ............................................... H01J 37/30
[52] U.S. Cl. ................................ 250/492.21; 250/397
[58] Field of Search ........................ 250/492.21, 397; 315/111.81

[56] References Cited

U.S. PATENT DOCUMENTS

| | | | |
|---|---|---|---|
| 4,357,536 | 11/1982 | Varma et al. | 250/397 |
| 4,384,918 | 5/1983 | Abe | 156/643 |
| 4,399,016 | 8/1983 | Tsukada et al. | 204/192 R |
| 4,517,465 | 5/1985 | Gault et al. | 250/492.21 |
| 4,732,761 | 3/1988 | Machida et al. | 437/228 |
| 4,764,394 | 8/1988 | Conrad | 427/38 |
| 4,785,188 | 11/1988 | Mori et al. | 250/397 |
| 4,849,641 | 7/1987 | Berkowitz | 250/492.21 |
| 4,881,010 | 11/1989 | Jetter | 315/111.81 |
| 4,897,171 | 1/1990 | Ohmi | 204/298 |
| 4,929,840 | 5/1990 | Dykstra et al. | 250/492.21 |
| 4,937,205 | 6/1990 | Nakayama et al. | 250/492.21 |
| 5,122,251 | 6/1992 | Campbell et al. | 204/298.06 |
| 5,212,425 | 5/1993 | Goebel et al. | 250/492.21 |

OTHER PUBLICATIONS

Article by X. Y. Qian, et al., entitled "Sub–100nm P+/N Junction Formation Using Plasma Immersion Ion Implantation", published in *Nuclear Instruments & Methods in Physics Research*, Section B (Beam Interactions with Materials and Atoms), vol. B55, No. 1–4, in Apr. 1991.

Article by Nathan W. Cheung, entitled "Plasma Immersion Ion Implantation for ULSI Processing", published in *VII. Trends & Applications*, in 1991, pp. 811–820.

Memorandum No. UCB/ERL M90/84 by X. Y. Qian, et al., entitled "Plasma Immersion Ion Implantation for VLSI Fabrication", published by College of Engineering, University of California, Berkeley, on Sep. 13, 1990.

Article by X. Y. Qian, et al., entitled "Conformal Implantation for Trench Doping with Plasma Immersion Ion Implantation", published in *Nuclear Instruments & Methods in Physics Research*, Section B (Beam Interactions with Materials and Atoms), vol. B55, No. 1–4, pp. 898–901, in Apr. 1991.

Article by X. Y. Qian, et al., entitled "Plasma Immersion Pd Ion Implantation Seeding Pattern Formation for Selective Electroless Cu Plating", published in *Nuclear Instruments & Methods in Physics Research*, Section B (Beam Interactions with materials and Atoms), vol. B55, No. 1–4, pp. 888–892, in Apr. 1991.

Primary Examiner—Bruce C. Anderson
Attorney, Agent, or Firm—Gerald M. Fisher

[57] ABSTRACT

A charge measuring system for determining implantation dose in a PI$^3$ system with means to compensate for current in the charge sensor which does not arise from positive ions arriving on the wafer.

11 Claims, 9 Drawing Sheets

CHARGE MONITOR FOR HIGH POTENTIAL PULSE CURRENT DOSE MEASUREMENT APPARATUS AND METHOD

FIELD OF THE INVENTION

This invention relates to methods and apparatus for measuring charge accumulated by a sample with particular application to the measurement of ion current collected by a semiconductor wafer in a plasma doping system.

RELATED INVENTION

This invention relates to a simultaneously filed patent application entitled "PI$^3$ (Plasma Immersion Ion Implantation) Apparatus", inventor T. Shering, Serial No. 059036 and later filed divisional therof entitled: PI$^3$ (Plasma Immersion Ion Implantation) Method, Inventor T. Sheng Varian Case No. 94-10.

BACKGROUND OF THE INVENTION

Electrometers are the most common tool used to measure the accumulation of charge flowing through a circuit. In standard raster scan ion implantation, the Faraday cup is used to measure the flow of charge to the substrates. It is important to measure the flow of charges in order to determine the dose, i.e. ions per square centimeter, implanted.

Modern electronic devices are based on semiconductor materials. Semiconductor materials in their native state have very low intrinsic conductivity and it is necessary to add small amounts of certain types of impurities into the crystal lattice to provide current carriers.

High temperature gas diffusion and raster scan ion implantations have been the known techniques for doping selective impurity into semiconductors. Very recently, it has become recognized that raster scan ion implantation has limitations at low energy beam conditions, under 10 KV, especially where dose and production wafer throughput are of concern. Shallow junction devices have become more important and a new implantation approach known as Plasma Immersion Ion Implantation (PI$^3$) is being studied. PI$^3$ uses lower energy and provides high dose rate. In PI$^3$ the use of an electrometer to measure dose is not practical because of the difficulty of inserting an electrometer into an electrode especially if a biasing voltage is used. Also, the electrometer typically has a slow response time and the electrometer cannot distinguish between unwanted and wanted portions of current flow into the electrode.

SUMMARY OF THE INVENTION

An object of this invention is to enable measurements of charge accumulated by a sample pulsed to a high potential.

A still further object is to enable compensation of current sensor measurements to eliminate portions of sensed waveforms which occur after the charge pulse is turned off.

DETAILED DESCRIPTION OF THE INVENTION

The prior art PI$^3$ structures and methods of Conrad as described in U.S. Pat. No. 4,764,394 employs a so called hot cathode process which continuously maintains a plasma to generate positive ions and applies pulses of negative voltage to accelerate the ions toward the workpiece. The earlier PI$^3$ work of Cheung et al at Berkeley and the work at the Varian labs also operated a continuous electron cyclotron resonance (ECR) produced plasma discharge in BF$_3$ gas and employed a highly negative pulse to the primary cathode behind the wafer to accelerate positive ions to the wafer. It has been discovered that use of a continuously produced plasma causes: (1) significant concentrations of impurities to be etched from the chamber and to be implanted in the wafer; and (2) formation of large particles to be deposited on the wafer surface. Experiments show that a continuous BF$_3$ plasma discharge contains highly reactive species which etch the exposed surfaces in the chamber as well as the wafer. Also, the particles, of mostly silicon, grow continuously and deposit on the surface.

It is now possible to use a process known as a cold cathode discharge to obtain the desired implantation but to avoid both of these problems. The cold cathode process relies on secondary emission of electrons to ionize the gas. Specifically, without a continuous plasma in the chamber, by using a highly negative pulse, a plasma will be created which is only in place when the pulse is on.

For a six inch wafer, a primary pulse on the order of 10 microseconds with a low duty cycle, i.e. 1% is preferred. However, so long as the primary pulse width is less than on order of 15 milliseconds, no significant particle formation occurs. Shorter pulse widths are preferred for smaller diameter wafers. For a continuous plasma, after 15 milliseconds, the particles seem to reach a critical diameter and they form and deposit on the surface in great concentrations.

We also employ a very short high voltage pulse to a second cold cathode for electron source to produce neutralizing electrons which flow to the workpiece to prevent oxide breakdowns.

Figure 1:
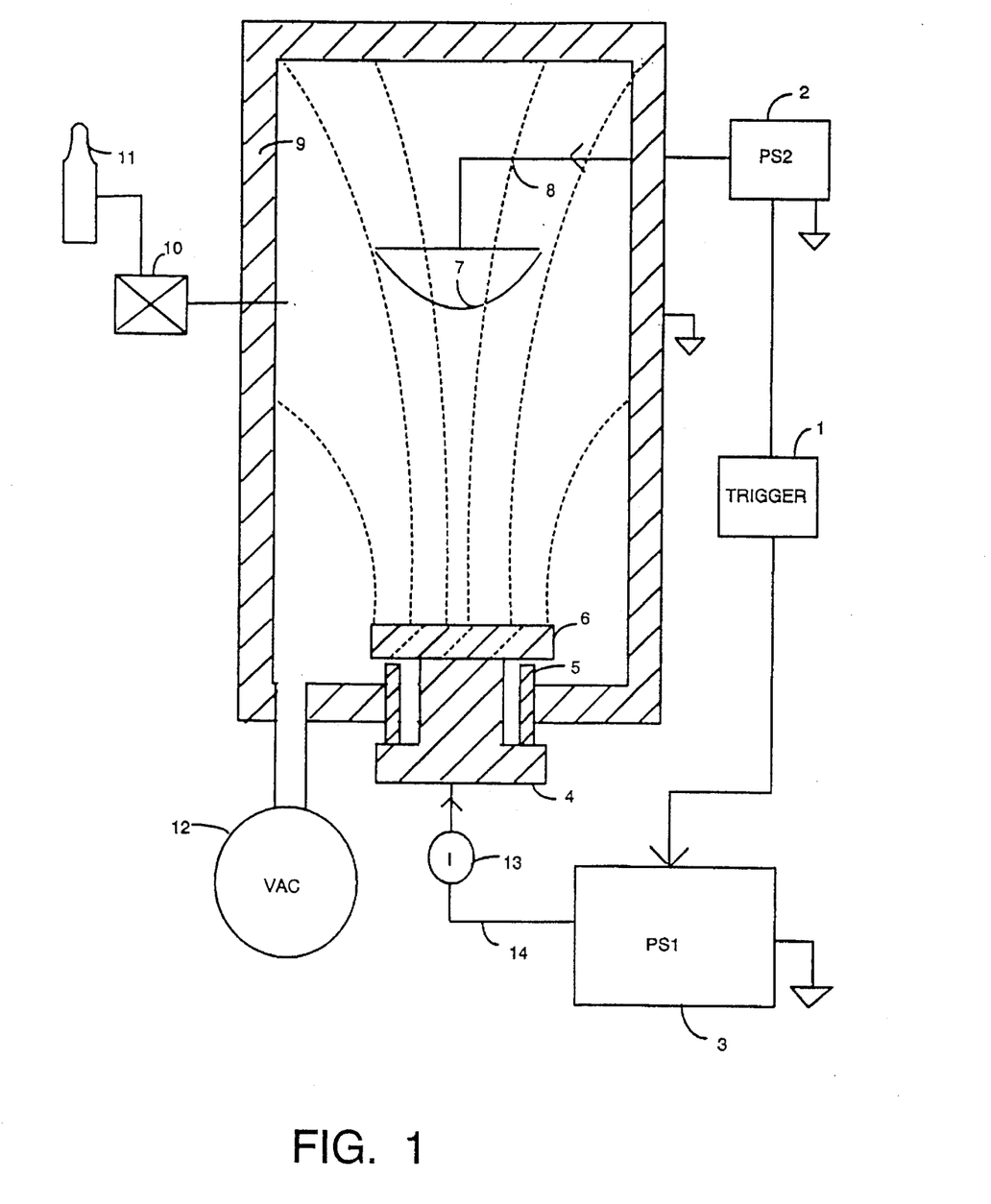
FIG. 1 is a block diagram schematic of the inventive PI$^3$ system.

With reference to FIG. 1, a chamber 9 of aluminum alloy is evacuated by a pump 12 to pressures on the order of 1 mTorr, while BF$_3$ is introduced into the chamber via mass flow controller 10 from bottle 11. A wafer 6 is mounted to an electrode 4 in a wall of chamber 9 which electrode is shielded electrically by annular cylindrical walls 5 which are electrically connected to the chamber wall 9. PS1, the high voltage power supply 3 for providing a pulse on order of negative 5 KV is connected to the electrode 4 via conductor 14. A current sensor 13 is in the line 14. In the chamber, an electron source 7 is shown centrally located with respect to the electrode 4 but removed from the electrode 4 to provide a uniform flow of electrons to the wafer which is responsive to a large negative pulse applied to the cathode 7 from the second power supply PS2, i.e. on the order of negative 2KV. The two power supplies PS1 and PS2 are each timed in respect to a single trigger source so that they can have their pulses precisely synchronized.

Since there is no pre-ionization of the gas, the pulsed negative voltage applied to the electrode 4 on the order of 5 KV, creates electric fields lines which travel from the face of the electrode 4 to the uniform potential chamber wall. These lines are controlled by the geometry of the housing.

Since electrons are lighter and very mobile, and since the field lines all focus down to the face of electrode 4, the electrons in close proximity to the wafer 6 start stripping from the gas upon application of the pulse. This leaves the more slow moving positive ions so formed in the region. These ions are then accelerated and implanted into the wafer. The uniformity of dose implant is on the order of 2% over a 6 inch wafer for 1 sigma distribution.

The short duration ionization pulses do not completely eliminate chamber wall etching so that impurities do form but only during the pulse on-time.

It has been determined that many of the larger particles which had formed using continuous ionization are negatively charged. By using a small negative bias from Bias Supply 15, it is possible to deflect those negatively charged ions from reaching the wafer.

Figure 3:
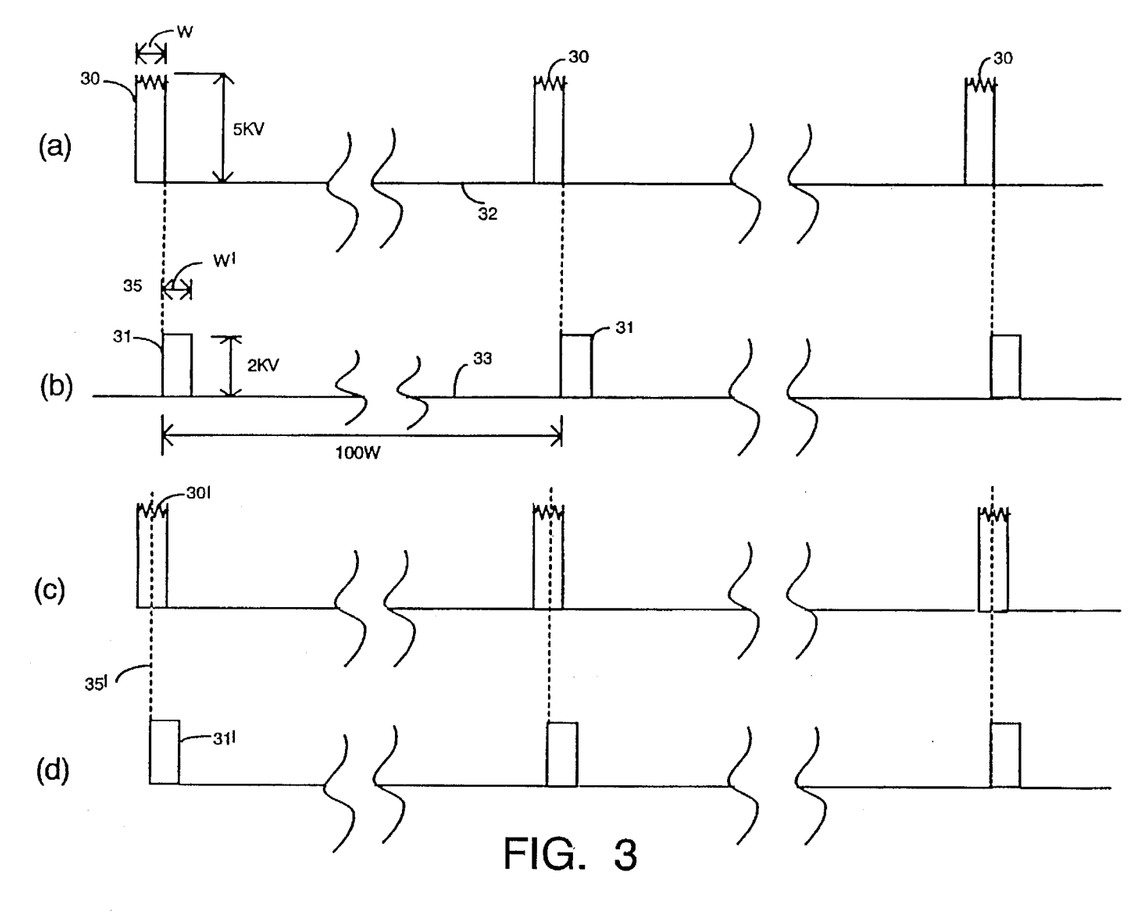
FIG. 3(a) and 3(b) are timing diagrams illustrative of the preferred relationship of the anode pulse and the cathode pulse.
FIG. 3(c) and 3(d) are timing diagrams illustrative of similar pulses which overlap in time.

With reference to FIG. 3(a) and FIG. 3(b), the voltage pulses 30 from PS1 are shown followed immediately by a voltage pulse train 31 from PS2. The pulse width W of the pulse train 30 is preferably 1–30 microseconds and the pulse period is on the order of 100 W. The pulse width W' of the PS1 pulse is on the same order. Both pulses 30 and 31, are shown in positive format for convenience of illustration. The best manufactured yield from the standpoint of repeatable percentage of good devices/total devices has been obtained when the pulse 31 follows immediately after pulse 30 ends. However, as shown in FIG. 3(c) and 3(d), pulses 30' and 31' can overlap in time so that the electrons are neutralizing the dielectric simultaneous with the ion implant. For reasons which are not understood, although some of the benefits of the invention are obtained, the yield of acceptable devices is not as high or as repeatable with such overlapping pulses.

The cold cathode 7 has been selected of a non-contaminating material or is clad with such a material. High purity amorphous carbon is preferred, although Ni is also acceptable because it is inert in fluorine plasma. The geometry of the electrode 7 surface is also important. Efficiency of electron emission by methods of surface roughening has been found useful for increasing the electron flooding density. A generally concave outer surface provides more surface area than a planar device and may be preferred for providing more uniform field lines at the wafer surface.

After anneal of an implanted wafer, we have demonstrated sheet resistance of 130 to 1K ohms/square, preferably of 150 ohms/square and a junction depth of about 900 Å. Also the particle count is less than 1 particle/cm$^2$ in a non-clean room environment (0.3→2.5 μm particle diameter). For comparison, the particles count for the BF$_3$ ECR process was several orders of magnitude higher.

Figure 2:
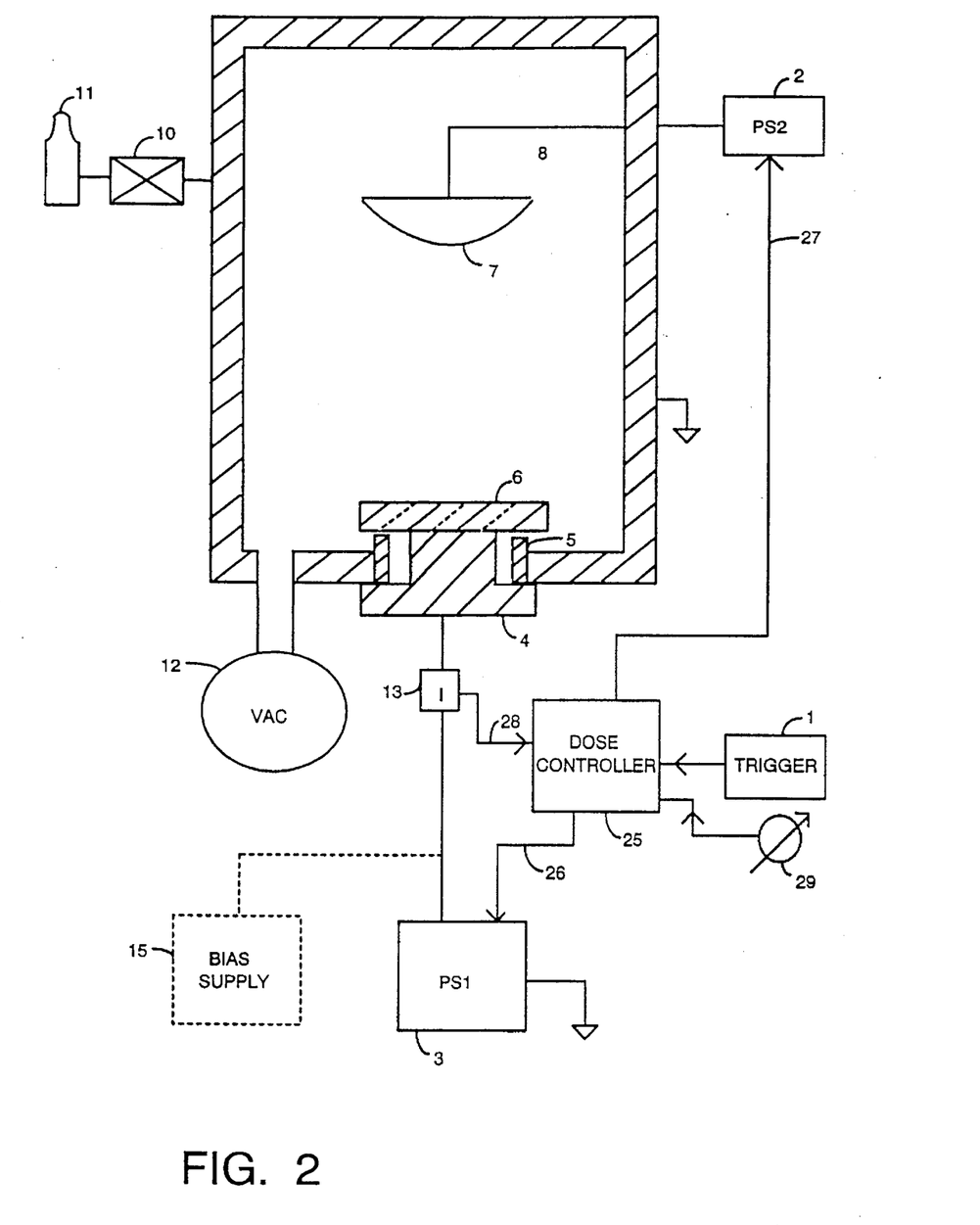
FIG. 2 is a more detailed block diagram of the inventive PI$^3$ system including an automatic dose controller

With reference to FIG. 2, we show the current sensor 13 being connected to a dose controller 25. In this embodiment, the dose controller, responsive to a dose selection 29, can measure the progress during implantation and shut down the power supplies 2 and 3 when the desired dose is achieved.

Since PS1 and PS2 are inductive power supplies, it is impossible to turn off the pulse current instantly. This complicates the ability of the dose controller to determine the ion dose which has been implanted. So long as the ion implantation voltage pulse is less than 10 KV, secondary electrons produced at the wafer surface of silicon are less than 3%. Accordingly, with PS1 turned off, the current pulse waveform measured by sensor 13 is of the form illustrated in FIG. 4(a). This waveform comprises a region 41 in which current indicates positive ion flow to the surface of the wafer 6 in response to the pulses from PS2. Also seen in FIG. 4(a) waveform is a region 42 in which a current is indicated which is due to the inability of the current to instantaneously stop due to the flux linkages from the inductively produced current from the bower supply. In order to measure the dose of the positive ions, it is necessary to eliminate the portion 42 of the waveform 40 which is not due to the positive ion current. With this goal in mind, we have provided a circuit to convert the sensed current waveform 40 into a waveform 44 which tracks the rise and fall time of the pulse 41 but completely eliminates the opposite polarity portion 42 as seen in the region 43. Having produced the waveform 44, it is now possible to integrate each pulse 36 to reach a measure of the total ion implantation, i.e. dose as a function of time.

Figure 5:
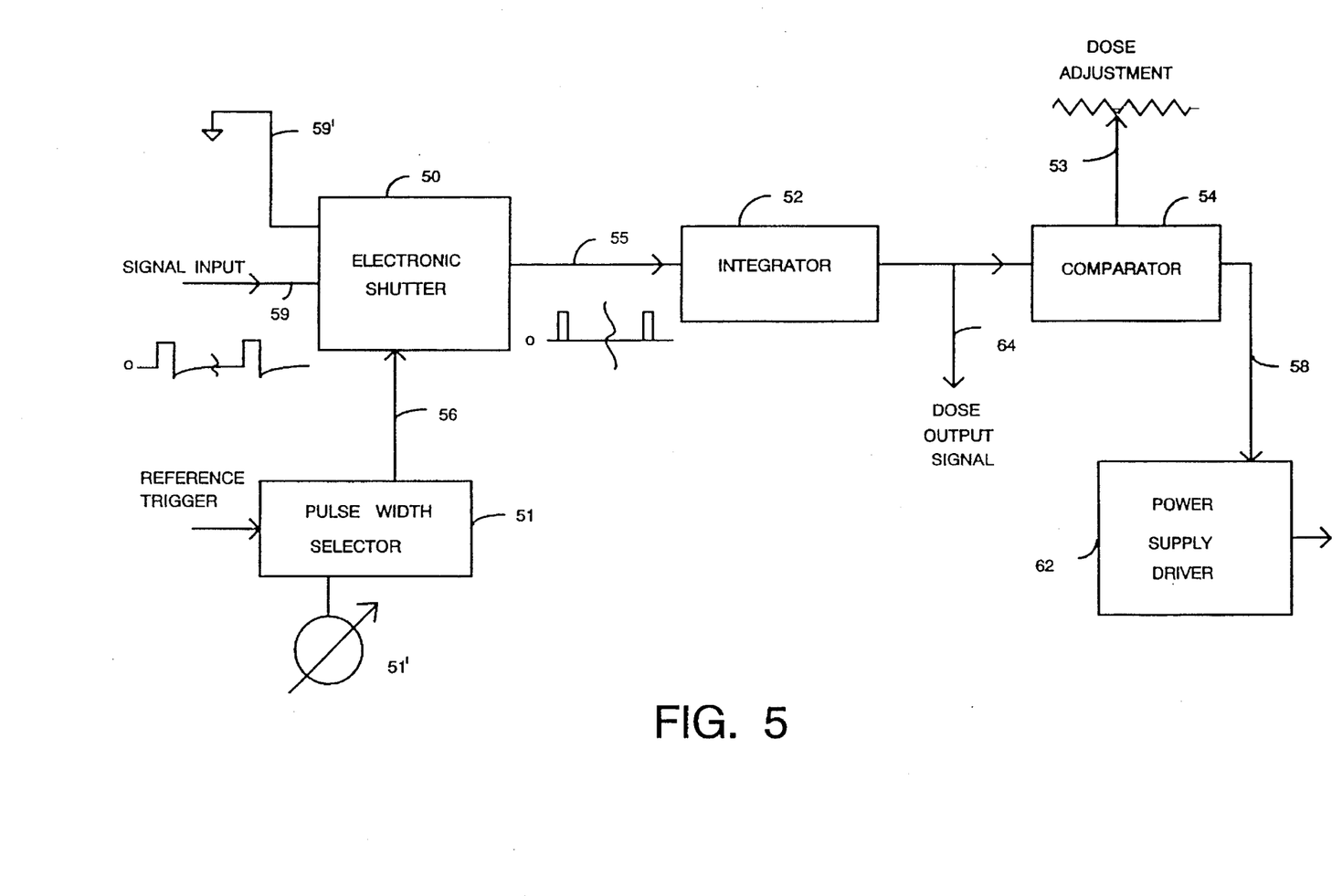
FIG. 5 is a block schematic diagram of the dose controller.

The block diagram of FIG. 5 is illustrative of the dose control circuit elements. The input 59 is a current waveform having two polarities with respect to ground. The signal 59 is received by an electronic shutter 50.

Also connected to the electronic shutter is a pulse width selector 51 which has a manual pulse width adjuster 51. Connected to the pulse width selector 51 is a Reference Trigger from Trigger Generator 1. There are many different circuits which can accomplish the desired pulse shutter function. The circuit described below is one alternative but many other circuits are possible.

Figure 4:
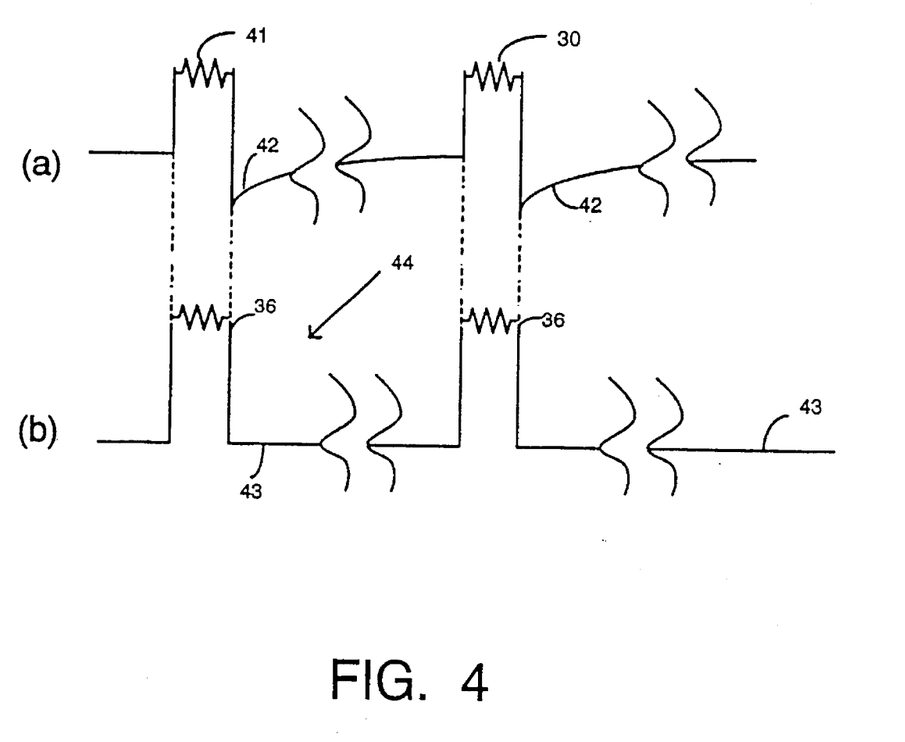
FIG. 4(a) is illustrative of the current measured in a series current sensor in the anode circuit.
FIG. 4(b) is the anode current after deletion of the negative portion in FIG. 4(a).

When the pulse width from pulse width selector 51 is exactly the same width as the positive portion 41 of FIG. 4(a), the output of the shutter 50 will switch to ground and have the negative portion 42 removed and the signal 55 into the integrator 52 will be as shown in FIG. 4(b). The output 64 of the integrator 52 is available as an indicator of the dose and is provided to the comparator 54. The comparator 54 accepts selection adjustment 53 to establish a stable voltage dose adjustment as a reference level. When the analogue integrated voltage 64 exceeds the reference 53, the comparator 58 sends a signal 58 to turn off the power supply 3 and end the implantation of the workpiece.

Figure 6:
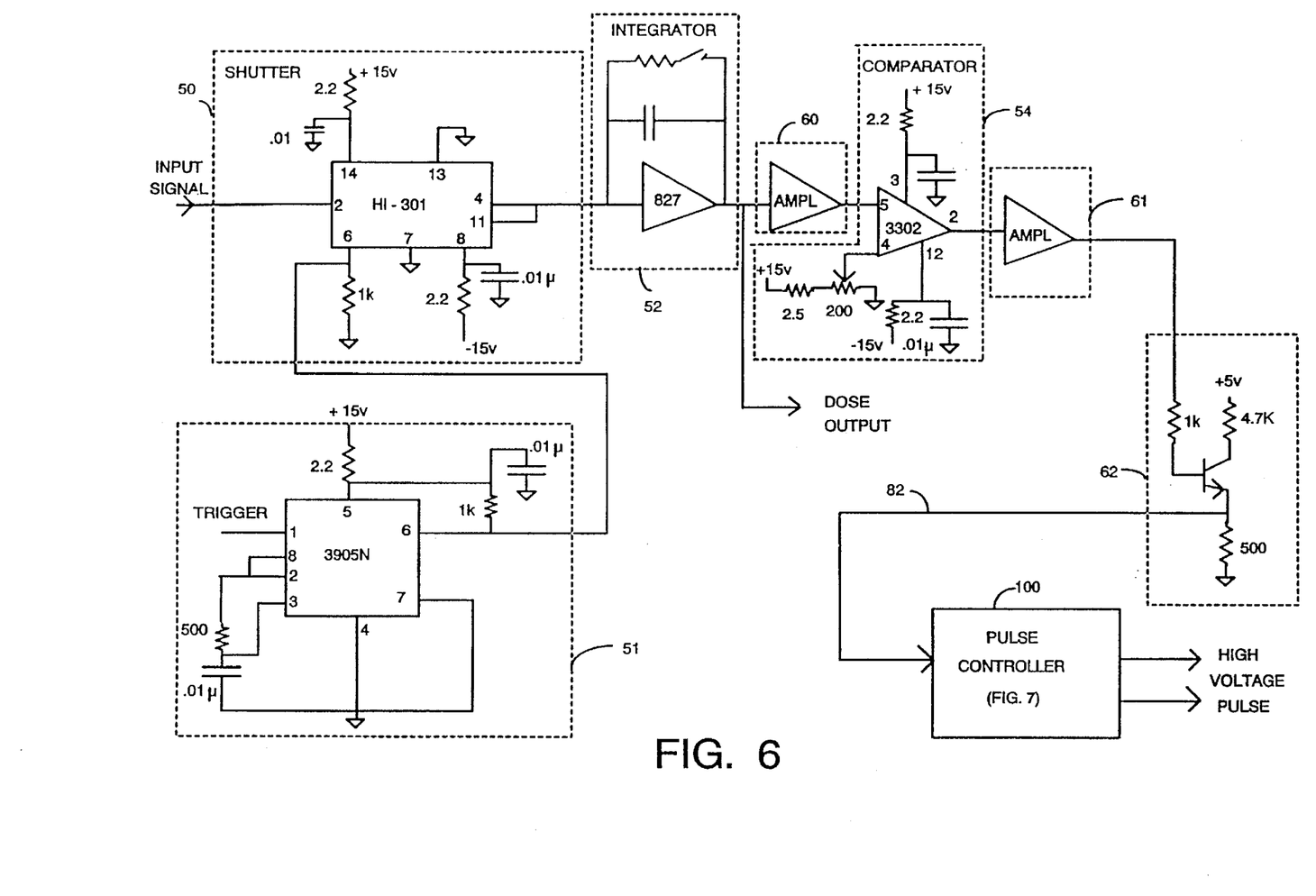
FIG. 6 is schematic diagram of a preferred dose controller.

With reference to FIG. 6, circuits are shown in detail which can carry out the functions of the block diagram of FIG. 5. The trigger circuit 51 is based on a 3905N chip manufactured by National Semiconductor Corporation. The adjustable 500 ohm resistor connected between pins 2 and 3 is a 30 turn precision resistor. This circuit is a timer circuit in which the RC time constant determines the on time. Other circuits such as standard one-shot multivibrator circuits would satisfy this requirement.

The pulse out on pin 6 of the 3905N chip is connected to pin 6 of the HI-301 chip made by Harris Corporation. The HI-301 is a very fast switch circuit which passes the input signal on pin 2 to the output pin 4 as long as the pin 6 input is high and when pin 6 goes low, the pin 4 output goes to the signal on pin 7 which is grounded. Using an oscilloscope to manually adjust the "on time" of timer 51, we have adjusted the shutter switching time very easily within 1.0 microseconds of the pulse off time of pulser voltage.

The output from pin 4 of HI-301 is connected to an integrator circuit 52 connected around an OP-AMP 827 made by Analog Devices. A manual switch SWI is connected in the feedback to provide a selection of time constants. The integrator is more fully depicted in FIG. 6(d).

Figure 6A:
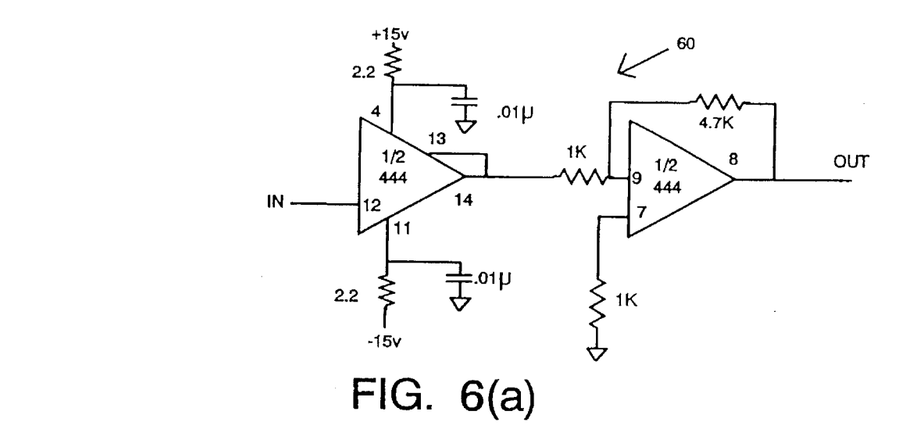
FIG. 6(a) schematic of an illustrative amplifier of FIG. 6.
Figure 6B:
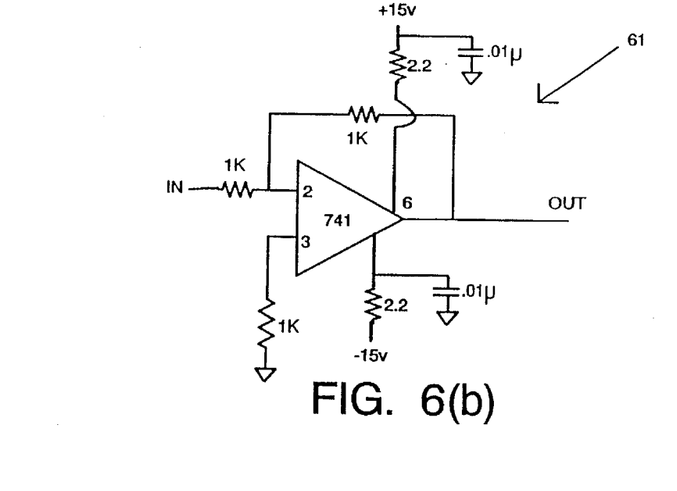
FIG. 6(b) is a schematic of another amplifier of FIG. 6.
Figure 6C:
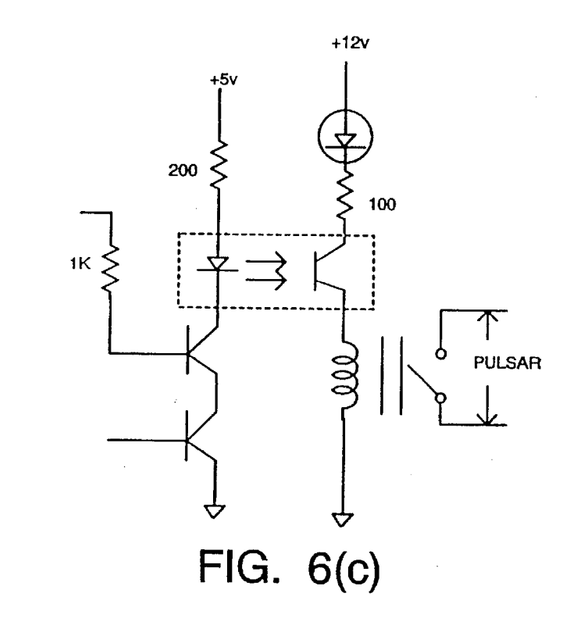
FIG. 6(c) is a schematic of the high voltage pulse control circuit of FIG. 6.
Figure 6D:
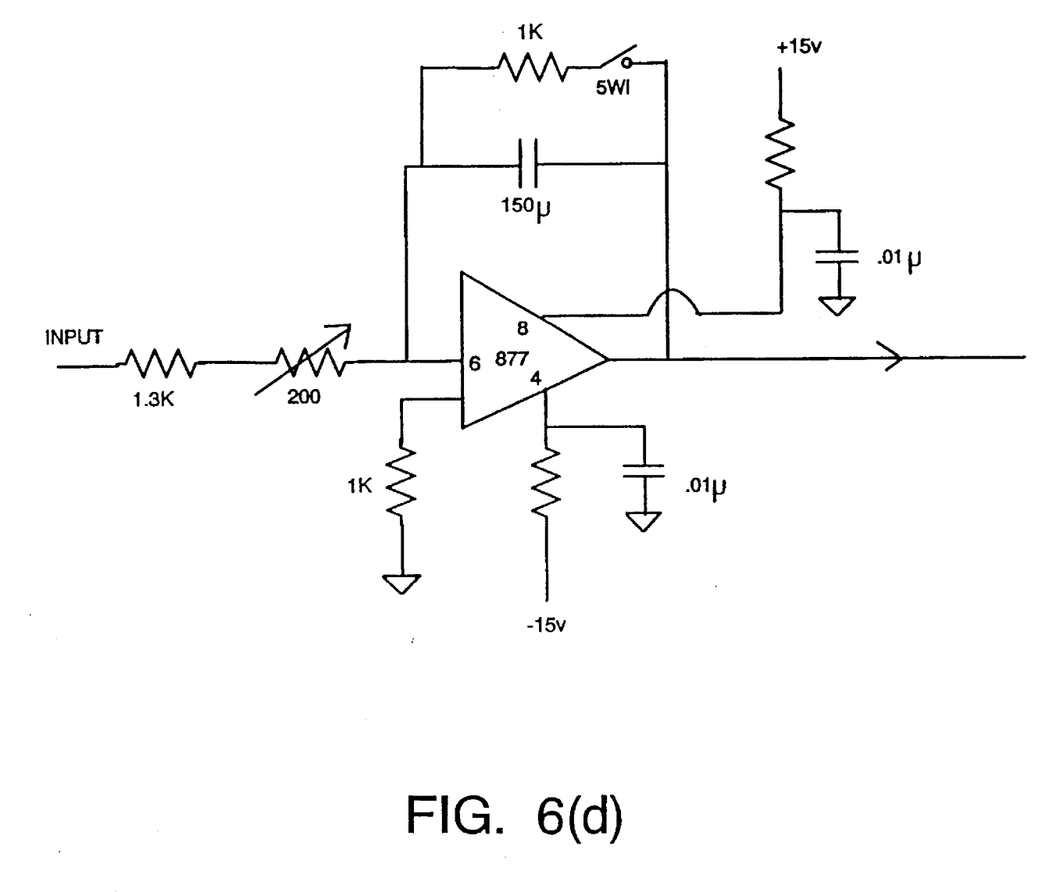
FIG. 6(d) is the schematic of the integrator circuit of FIG. 6.
Figure 7:
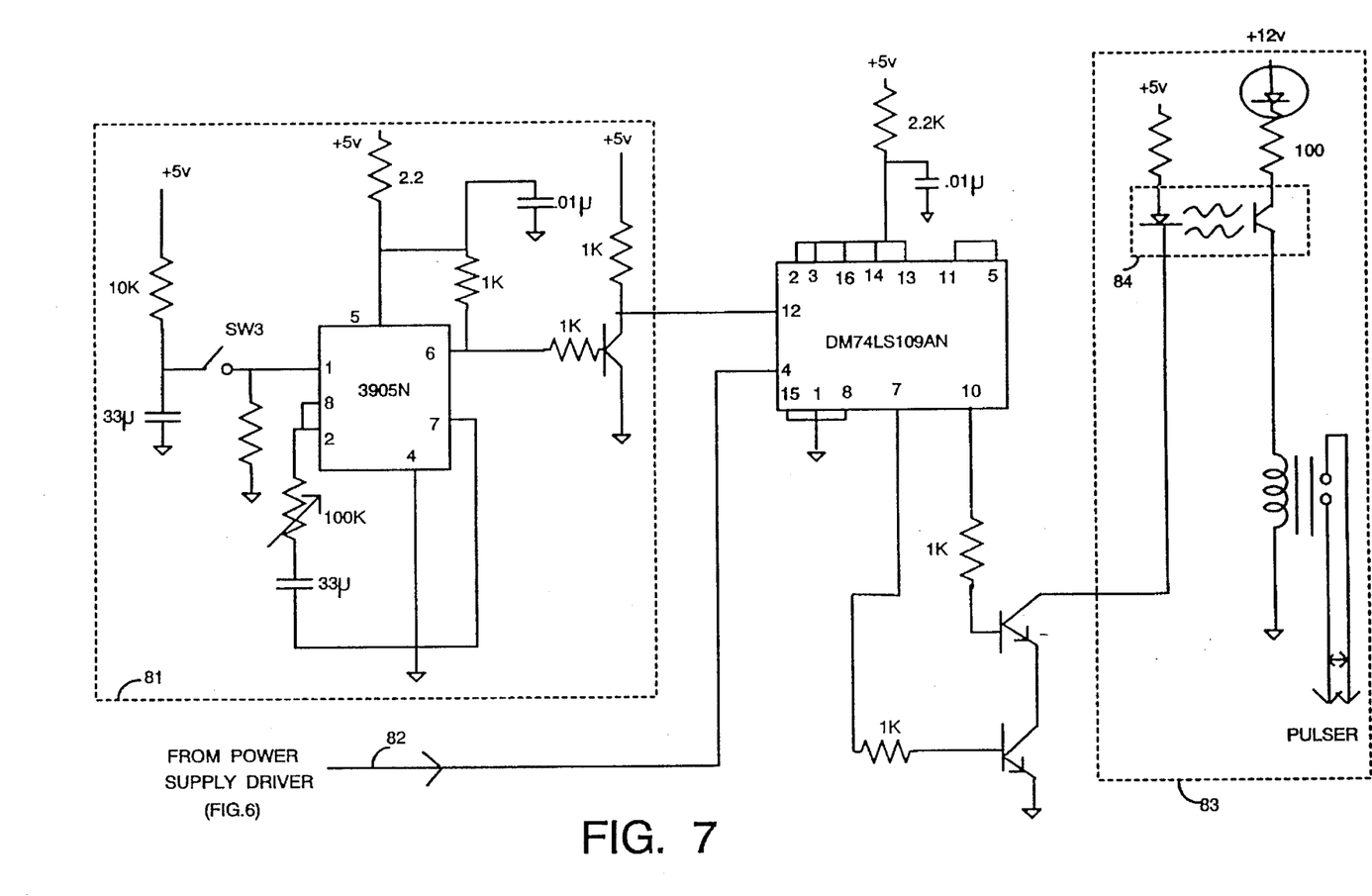
FIG. 7 is a schematic of the pulser control circuit of FIG. 6.

Amplifier 60 is more fully described in FIG. 6(a) and is a voltage follower on a single 444 chip made by National Semiconductor Corporation. The amplifier output of circuit 60 is connected to the comparator circuit 54. Comparator circuit 54 provides an output on pin 2 of the 3302 chip made by Motorola which switches between 5 V and ground depending on the level of the two inputs pins 5 and 4. Since the voltage at pin 4 is selectable by adjusting the 200 ohm potential divider connected to pin 4, the user is able to adjust the dose level at which the comparator output switches. The comparator 54 output is connected to a voltage follower 61 which can drive any control circuit to shut down the high voltage pulse generator in desired sequence. An example is the power supply driver circuit 62 more fully described in FIG. 6(b). The power supply driver 62 is connected to pulse controller 100 which is more fully described in FIG. 7. A timer 81 is connected to a DM74L5109AN chip made by National Semiconductor Corporation for driving the Pulse Generator 83 through the opto isolator 84. Pulse Generator 83 is Model 350 made by Velonix Inc., San Diego, Calif.

It is understood that the present invention is not limited to the particular embodiments set forth herein but embraces all such modified forms which come with the scope of the following claims.

What is claimed is:

1. A method for measuring ion implantation dose in a wafer in a plasma ion immersion implantation system comprising:

sensing total current flow to an electrode supporting said wafer said current being generated in response to application of a high voltage pulse, said total current having a first and second portion distinguishable in time;

discriminating between said first portion of sensed current which corresponds to positive ion implantation and said second portion of said sensed current which corresponds to inductively induced electron flow in said electrode flux linkages present in the pulsing circuit at the instant of turning off said high voltage pulse;

integrating a signal representative of only said first portion of said sensed current as a function of time; and providing an integration result as an output value of total charge representative of ion implantation dose into said wafer.

2. The method of claim 1 wherein said method of discriminating between said first portion of sensed current and said second portion of sensed current comprises:

providing a signal representative of said first portion of said sensed current for integration at substantially the same instant that said first portion of sensed current commences; and providing a zero potential signal for integration when said first portion of said sensed current ends.

3. The method of claim 2 wherein said step of providing a zero potential signal for integration is determined by the falling edge transition of said instantaneous value of said sensing current after said first portion of sensed current commences.

4. The method of claim 2 wherein said step of providing said first portion of sensed current for integration commences in response to a trigger signal inititating said high voltage pulse.

5. The method of claim 1 further comprising:

comparing said integrated result representative of implantation dose against a preselected value; and sending an output signal indicative of the instant in time when said comparing step determines that said preselected value of implantation dose has been attained, which output signal enables said power supply to discontinue said implantation.

6. Apparatus for measuring charge accumulated on a sample in a vacuum chamber that is simultaneously exposed to a plasma and pulsed to a high potential, comprising:

cold plasma discharge means for sustaining said plasma in said chamber;

an electrode having a planar surface for supporting said sample in said plasma sustaining chamber;

a high voltage pulse power supply, said high voltage power supply being electrically connected between said electrode and said chamber;

an electrode current sensor being electrically connected between said power supply and said electrode, said electrode current sensor having an output signal representative of charge flow from said electrode; and a dose controller circuit being electrically connected to receive output signals, from said electrode current sensor, said dose controller circuit having a first circuit for discriminating between a first portion of said current sensor output signal corresponding to ion implantation and a second portion of said current sensor output signal not corresponding thereto, and a second circuit for integrating over time only said first portion of said current sensor output signal.

7. The apparatus of claim 6 wherein said first circuit for discriminating between said first and said second portions of said current sensor output signal comprises means for switching only said first portion of said current sensor output signal as the output of said first circuit during said first portion of said current sensor output signal.

8. The apparatus of claim 7 wherein said first circuit for discriminating further includes means to output a zero potential signal to said second circuit for integrating over-time during said second portion of said current sensor output signal.

9. The apparatus of claim 7 wherein said first circuit includes a falling edge determination means for sensing when said first portion of said current sensor output signal ends.

10. The apparatus of claim 9 wherein said edge determination means is an adjustable timer circuit.

11. The apparatus of claim 7 further including a comparator circuit, said comparator circuit providing an output signal to indicate that instant of time when the time integral of said first portion of said current sensor output signal is equal to a preselected reference signal said preselected reference signal being representative of a desired implantation dose adjustment.

\* \* \* \* \*